(12) United States Patent
Vahala et al.

(10) Patent No.: US 10,067,031 B2
(45) Date of Patent: Sep. 4, 2018

(54) OPTICAL FREQUENCY MEASUREMENT AND CONTROL USING DUAL OPTICAL-FREQUENCY COMBS

(71) Applicants: California Institute of Technology, Pasadena, CA (US); The Regents of the University of California, Oakland, CA (US); National Institute of Standards and Technology, Gaithersburg, MD (US)

(72) Inventors: Kerry Vahala, Pasadena, CA (US); John E. Bowers, Santa Barbara, CA (US); Kartik A. Srinivasan, Gaithersburg, MD (US); Scott B. Papp, Boulder, CO (US); Scott A. Diddams, Boulder, CO (US)

(73) Assignees: CALIFORNIA INSTITUTE OF TECHNOLOGY, Pasadena, CA (US); THE REGENTS OF THE UNIVERSITY OF CALIFORNIA, Oakland, CA (US); THE UNITED STATES OF AMERICA, Washington, DC (US)

( * ) Notice: Subject to any disclaimer, the term of this patent is extended or adjusted under 35 U.S.C. 154(b) by 0 days.

(21) Appl. No.: 15/590,005

(22) Filed: May 8, 2017

(65) Prior Publication Data
US 2018/0095003 A1 Apr. 5, 2018

Related U.S. Application Data

(60) Provisional application No. 62/332,575, filed on May 6, 2016.

(51) Int. Cl.
*G01M 11/00* (2006.01)
*H01S 3/08* (2006.01)
(Continued)

(52) U.S. Cl.
CPC ............ *G01M 11/333* (2013.01); *G05D 25/02* (2013.01); *H01S 3/08027* (2013.01); *H01S 3/1003* (2013.01)

(58) Field of Classification Search
CPC .................. H01S 3/08027; H01S 3/1003; G01M 11/333; G05D 25/02
See application file for complete search history.

(56) References Cited

U.S. PATENT DOCUMENTS

| 8,818,146 B2 | 8/2014 | Vahala et al. |
| 9,293,887 B2 | 3/2016 | Li et al. |
| 2015/0326320 A1* | 11/2015 | Fertig ............... H04B 10/503 398/115 |

OTHER PUBLICATIONS

P. Del Haye, A. Schliesser, O. Arcizet, T. Wilken, R. Holzwarth and T. J. Kippenberg, "Optical frequency comb generation from a monolithic microresonator", Nature 450, 1214 (2007).

(Continued)

*Primary Examiner* — Armando Rodriguez
(74) *Attorney, Agent, or Firm* — David S. Alavi

(57) ABSTRACT

A dual-comb optical-frequency comb generator includes a tunable comb-generating laser, a coarse-comb generator, a fine-comb generator, a second harmonic generator, a coarse-comb offset photodetector, a dual-comb offset photodetector, and a fine-comb photodetector. The coarse comb is self-referencing and coupled to the fine comb so as to enable absolute determination of the frequencies of the fine comb.

28 Claims, 10 Drawing Sheets

(51) Int. Cl.
*H01S 3/10* (2006.01)
*G05D 25/02* (2006.01)

(56) References Cited

OTHER PUBLICATIONS

M. J. R. Heck, J. F. Bauters, M. L. Davenport, J. K. Doylend, S. Jain, G. Kurxzveil, S. Srinivasan, Y. Tang and J. E. Bowers, "Hybrid Silicon Photonic Integrated Circuit Technology", IEEE J. Sel. Topics Quant. Electron. 19, 6100117 (2013).

J. C. Hulme, J. K. Doylend, and J. E. Bowers, "Widely tunable Vernier ring laser on hybrid silicon", Opt. Express 21, 19718-19722 (2013).

T. Komljenovic, et al., "Heterogeneous Silicon Photonic Integrated Circuits", J. Lightwave Technol. 34, 20-35 (2016).

S. Srinivasan, M. Davenport, T. Komljenovic, J. Hulme, D. T. Spencer, and J. E. Bowers, "Coupled-Ring-Resonator-Mirror-Based Heterogeneous III—V Silicon Tunable Laser", IEEE Photon. J. 7, 2700908 (2015).

T. Komljenovic, S. Srinivasan, E. Norberg, M. Davenport, G. Fish, and J. E. Bowers, "Widely Tunable Narrow-Linewidth Monolithically Integrated External-Cavity Semiconductor Lasers", IEEE J. Sel. Topics Quantum Electron. 21, 1501909 (2015).

J. Li, H. Lee, T. Chen, and K. J. Vahala, "Low-Pump-Power, Low-Phase-Noise, and Microwave to Millimeter-Wave Repetition Rate Operation in Microcombs", Phys. Rev. Lett. 109, 233901 (2012).

H. Lee, T. Chen, J. Li, K. Y. Yang, S. Jeon, O. Painter and K. J. Vahala, "Chemically etched ultrahigh-Q wedge-resonator on a silicon chip," Nature Photon. 6, 369-373 (2012).

Th. Udern, J. Reichert, R. Holzwarth, and T. W. Hänsch, "Absolute Optical Frequency Measurement of the Cesium D1 Line with a Mode-Locked Laser", Phys, Rev. Lett. 82, 3568 (1999).

M. H. P. Pfeiffer, A. Kordts, V. Brasch, M. Zervas, M. Geiselmann, J. D. Jost, and Tobias J. Kippenberg, "Photonic Damascene process for integrated high-Q microresonator based nonlinear photonics", Optica 3, 20 (2016).

Q. Li, T. C. Briles, D. A. Westly, J. R. Stone, B. R. Ilic, S. A. Diddams, S. B. Papp, and K. Srinivasan, "Octave-spanning microcavity Kerr frequency combs with harmonic dispersive-wave emission on a silicon chip", Frontiers in Optics/Laser Science, Paper FW6C.5 (2015).

N. Volet, A. Spott, E. J. Stanton, M. L. Davenport, J. Peters, J. Meyer, and J. E. Bowers, "Semiconductor optical amplifiers at 2.0-µm wavelength heterogeneously integrated on silicon", in Conference on Lasers and Electra-Optics SM4G.4 (2016).

L. Chang, Y. Li, N. Volet, L. Wang, J. Peters, and J. E. Bowers, "Thin film wavelength converters for photonic integrated circuits"; Optica 3, 531 (2016).

Z. Li, Y. Fu, M. Piels, H. Pan, A. Beling, J. E. Bowers, and J. C. Campbell, "High-power high-linearity flip-chip bonded modified unitraveling carrier photodiode", Opt. Express 19, B385-B390 (2011).

M. L. Davenport, S. Skendži ć, N. Volet, J. C. Hulme, M. J. R. Heck, and J. E. Bowers, "Heterogeneous Silicon/III-V Semiconductor Optical Amplifiers", IEEE J. Sel. Topics Quantum Electron. 22, 3100111 (2016).

A. Spott, M. Davenport, J. Peters, J. Bovington, M. J. R. Heck, E. J. Stanton, I. Vurgaftman, J. Meyer, and J. Bowers, "Heterogeneously integrated 2.0 µm CW hybrid silicon lasers at room temperature", Opt. Lett. 40, 1480-1483 (2015).

M. Piels, J. F. Banters, M. L. Davenport, M. J. R. Heck, and J. E. Bowers, "Low-Loss Silicon Nitride AWG Demultiplexer Heterogeneously Integrated With Hybrid III—V/Silicon Photodetectors", J. Lightwave Technol. 32, 817-823 (2014).

Yang, K. Y., Oh, D. Y., Lee, S. H., Yang, Q. F., Yi, X. & Vahala, K. Integrated Ultra-High Q Optical Resonator. arXiv preprint arXiv:1702.05076 (2017).

U.S. Appl. No. 15/587,897 entitled "High-Q optical resonator with monolithically integrated waveguide" filed May 5, 2017 in the names of Vahala et al. (IFW).

* cited by examiner

OPTICAL FREQUENCY MEASUREMENT AND CONTROL USING DUAL OPTICAL-FREQUENCY COMBS

This application claims benefit of U.S. provisional App. No. 62/332,575 filed May 6, 2016 in the names of Kerry J. Vahala, John E. Bowers, Kartik A. Srinivasan, Scott B. Papp, and Scott A. Diddams, said provisional application being hereby incorporated by reference as if fully set forth herein.

STATEMENT REGARDING FEDERALLY SPONSORED RESEARCH OR DEVELOPMENT

This invention was made with government support under Grant No. HR0011-15-C-0055 awarded by the Defense Advanced Research Projects Agency (DARPA). The government has certain rights in the invention.

FIELD OF THE INVENTION

The field of the present invention relates to optical-frequency combs. In particular, examples of inventive apparatus and methods are disclosed herein wherein dual optical-frequency combs are employed for optical frequency measurement or control.

BACKGROUND

The following references disclose various aspects related to, inter alia, optical frequency combs, tunable laser sources, high-Q optical resonators, and second harmonic generation. Some of those disclosed aspects may be employed in examples of inventive apparatus or methods disclosed or claimed herein. Each of the following references is incorporated by reference as if fully set forth herein:

[1] P. Del Haye, A. Schliesser, O. Arcizet, T. Wilken, R. Holzwarth and T. J. Kippenberg, "Optical frequency comb generation from a monolithic microresonator", Nature 450, 1214 (2007);

[2] M. J. R. Heck, J. F. Bauters, M. L. Davenport, J. K. Doylend, S. Jain, G. Kurczveil, S. Srinivasan, Y. Tang and J. E. Bowers. "Hybrid Silicon Photonic Integrated Circuit Technology", IEEE J. Sel. Topics Quant. Electron. 19, 6100117 (2013);

[3] J. C. Hulme, J. K. Doylend, and J. E. Bowers, "Widely tunable Vernier ring laser on hybrid silicon", Opt. Express 21, 19718-19722 (2013);

[4] T. Komljenovic, et al., "Heterogeneous Silicon Photonic Integrated Circuits", J. Lightwave Technol. 34, 20-35 (2016);

[5] S. Srinivasan, M. Davenport, T. Komljenovic, J. Hulme, D. T. Spencer, and J. E. Bowers, "Coupled-Ring-Resonator-Mirror-Based Heterogeneous III-V Silicon Tunable Laser", IEEE Photon. J. 7, 2700908 (2015);

[6] T. Komljenovic, S. Srinivasan, E. Norberg, M. Davenport, G. Fish, and J. E. Bowers, "Widely Tunable Narrow-Linewidth Monolithically Integrated External-Cavity Semiconductor Lasers", IEEE J. Sel. Topics Quantum Electron. 21, 1501909 (2015);

[7] J. Li, H. Lee, T. Chen, and K. J. Vahala, "Low-Pump-Power, Low-Phase-Noise, and Microwave to Millimeter-Wave Repetition Rate Operation in Microcombs", Phys. Rev. Lett. 109, 233901 (2012);

[8] H. Lee, T. Chen, J. Li, K. Y. Yang, S. Jeon, O. Painter and K. J. Vahala, "Chemically etched ultrahigh-Q wedge-resonator on a silicon chip," Nature Photon. 6, 369-373 (2012);

[9] Th. Udem, J. Reichert, R. Holzwarth, and T. W. Hänsch, "Absolute Optical Frequency Measurement of the Cesium D1 Line with a Mode-Locked Laser", Phys. Rev. Lett. 82, 3568 (1999);

[10] M. H. P. Pfeiffer, A. Kordts, V. Brasch, M. Zervas, M. Geiselmann, J. D. Jost, and Tobias J. Kippenberg, "Photonic Damascene process for integrated high-Q microresonator based nonlinear photonics", Optica 3, 20 (2016);

[11] Q. Li, T. C. Briles, D. A. Westly, J. R. Stone, B. R. Ilic, S. A. Diddams, S. B. Papp, and K. Srinivasan, "Octave-spanning microcavity Kerr frequency combs with harmonic dispersive-wave emission on a silicon chip", Frontiers in Optics/Laser Science, Paper FW6C.5 (2015);

[12] N. Volet, A. Spott, E. J. Stanton, M. L. Davenport, J. Peters, J. Meyer, and J. E. Bowers, "Semiconductor optical amplifiers at 2.0-µm wavelength heterogeneously integrated on silicon", in Conference on Lasers and Electro-Optics SM4G.4 (2016);

[13] L. Chang, Y. Li, N. Volet, L. Wang, J. Peters, and J. E. Bowers, "Thin film wavelength converters for photonic integrated circuits"; Optica 3, 531 (2016);

[14] Z. Li, Y. Fu, M. Piels, H. Pan, A. Beling, J. E. Bowers, and J. C. Campbell, "High-power high-linearity flip-chip bonded modified unitraveling carrier photodiode", Opt. Express 19, B385-6390 (2011);

[15] M. L. Davenport, S. Skendžić, N. Volet, J. C. Hulme, M. J. R. Heck, and J. E. Bowers, "Heterogeneous Silicon/III-V Semiconductor Optical Amplifiers", IEEE J. Sel. Topics Quantum Electron., 22, 3100111 (2016);

[16] A. Spott, M. Davenport, J. Peters, J. Bovington, M. J. R. Heck, E. J. Stanton, I. Vurgaftman, J. Meyer, and J. Bowers, "Heterogeneously integrated 2.0 µm CW hybrid silicon lasers at room temperature", Opt. Lett. 40, 1480-1483 (2015);

[17] M. Piels, J. F. Bauters, M. L. Davenport, M. J. R. Heck, and J. E. Bowers, "Low-Loss Silicon Nitride AWG Demultiplexer Heterogeneously Integrated With Hybrid III-V/Silicon Photodetectors", J. Lightwave Technol. 32, 817-823 (2014);

[18] Yang, K. Y., Oh, D. Y., Lee, S. H., Yang, Q.-F., Yi, X. & Vahala, K. Integrated Ultra-High-Q Optical Resonator. arXiv preprint arXiv:1702.05076 (2017);

[19] U.S. Pat. No. 8,818,146 entitled "Silica-on-silicon waveguides and related fabrication methods" issued Aug. 26, 2014 to Vahala et al;

[20] U.S. Pat. No. 9,293,887 entitled "Chip-based laser resonator device for highly coherent laser generation" issued Mar. 22, 2016 to Li et al; and

[21] U.S. non-provisional application Ser. No. 15/587,897 entitled "High-Q optical resonator with monolithically integrated waveguide" filed May 5, 2017 in the names of Vahala et al.

SUMMARY

An inventive dual-comb optical-frequency comb generator comprises: (a) a tunable comb-generating laser; (b) a coarse-comb generator; (c) a fine-comb generator; (d) a second harmonic generator; (e) a coarse-comb offset photodetector; (f) a dual-comb offset photodetector; and (g) a fine-comb photodetector. The tunable comb-generating laser that generates a comb-generating laser signal at optical frequency $v_p$. The coarse-comb generator generates from a first portion of the comb-generating laser signal a coarse optical-frequency comb, which includes optical frequencies $v_N = v_p + N\Delta$. The coarse optical-frequency comb spans at least an octave of optical frequency. The fine-comb generator generates from a second portion of the comb-generating laser signal a fine optical-frequency comb, which includes optical frequencies $v_{N'}=v_p+N'\Delta'$ where $N'$ is an integer and $\Delta'$ is a fine-comb frequency spacing. The second harmonic generator generates, from a portion of the coarse optical-frequency comb that includes a comb optical signal at optical frequency $v_{N1}$, a second harmonic optical signal at an optical frequency $2v_{N1}$. The coarse-comb offset photodetector receives the second harmonic optical signal and also a portion of the coarse optical-frequency comb, including a comb optical signal at an optical frequency $v_{N2} \approx 2v_{N1}$, and generates a coarse-comb offset electrical signal at a coarse-comb offset frequency $f_0=|2v_{N1}-v_{N2}|$. The dual-comb offset photodetector receives portions of the coarse and fine optical-frequency combs, including comb optical signals optical frequencies $v_p+\Delta$ and $v_p+M\Delta'$, or $v_p-\Delta$ and $v_p-M\Delta'$ (M is the positive integer closest to $\Delta/\Delta'$), and generates a dual-comb offset electrical signal at a dual-comb offset frequency $f_1=|\Delta-M\Delta'|$. The fine-comb photodetector receives at least portions of the fine optical-frequency comb, and generates a fine-comb-spacing electrical signal at the fine-comb frequency spacing $\Delta'$. The measured values of $\Delta'$, $f_0$, and $f_1$ can be employed to determine or control the optical frequency $v_p$. One or more servo controllers can be employed to lock one or more of the measured values of $\Delta'$, $f_0$, or $f_1$ to corresponding reference frequencies.

An inventive tunable laser source comprises the dual-comb optical-frequency comb generator, and further comprises a tunable output laser and an output offset photodetector. The tunable output laser generates an output laser signal at an output optical frequency $v_{OUT}$. The output offset photodetector receives a portion of the fine optical frequency comb, including a comb optical signal at optical frequency $v_{N'}$, and a portion of the output laser signal, and generates an output offset electrical signal at an output offset frequency $f_2=|v_{OUT}-v_{N'}|$. The measured values of $\Delta'$, $f_0$, $f_1$, and $f_2$ can be employed to determine, control, or select the optical frequency $v_{OUT}$. One or more servo controllers can be employed to lock one or more of the measured values of $\Delta'$, $f_0$, $f_1$, or $f_2$ to corresponding reference frequencies.

Objects and advantages pertaining to optical-frequency combs may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Figure 1:
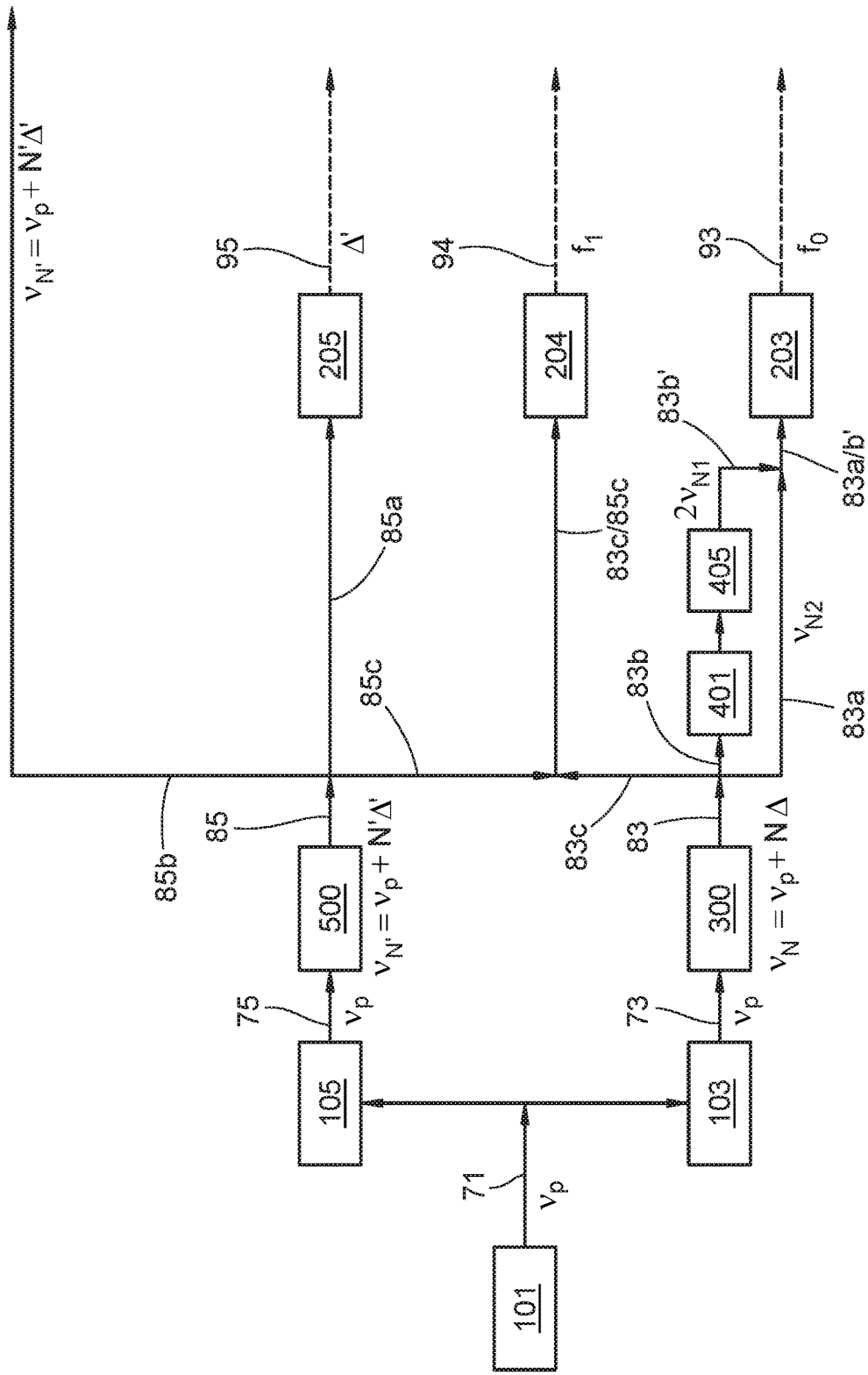
FIG. 1 illustrates schematically an example of an inventive dual optical-frequency comb generator.

The embodiments depicted are shown only schematically: all features may not be shown in full detail or in proper proportion, certain features or structures may be exaggerated relative to others for clarity, and the drawings should not be regarded as being to scale. For example, the actual optical-frequency comb spectra depicted as having a handful of comb lines typically have dozens or one or two hundred comb lines; the number of comb lines is reduced in the drawings for clarity. The embodiments shown are only examples: they should not be construed as limiting the scope of the present disclosure or appended claims.

DETAILED DESCRIPTION OF EMBODIMENTS

Figure 9:
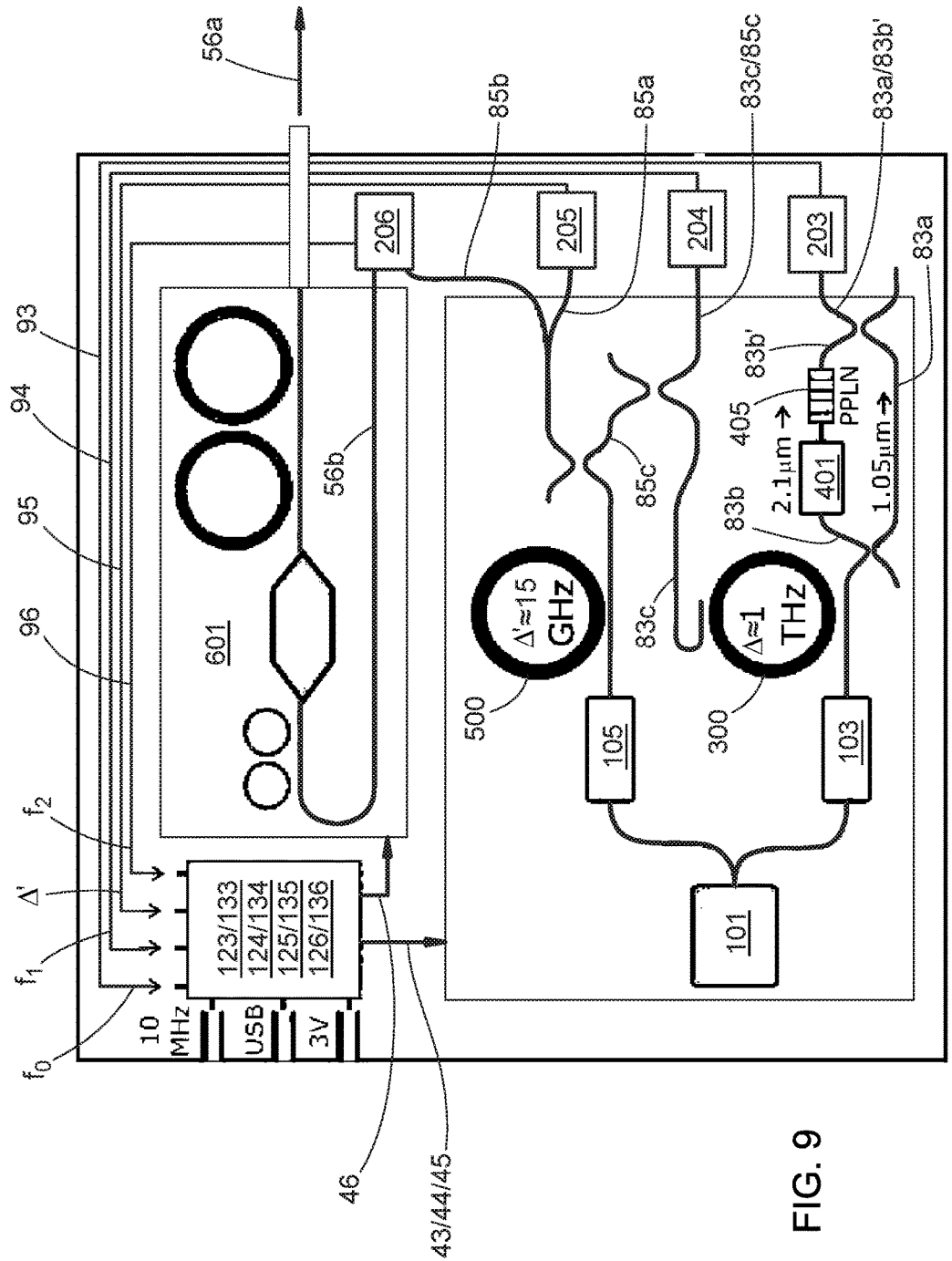
FIG. 9 illustrates schematically the example of FIG. 8 integrated onto a chip.

A very successful approach for the precise synthesis and control of optical frequencies at a level comparable to microwave techniques is based on femtosecond laser frequency combs. However, their role in real-world applications is limited, due to the size, weight, power and cost of existing mode-locked lasers. Another class of parametric frequency combs has later emerged based upon chip-compatible monolithic microresonators [1]. This new technology, together with rapidly maturing integrated active and passive photonic elements [2], provides the opportunity for advances in optical frequency synthesis. Disclosed herein are examples of, inter alia, a chip-scale, optical-resonator-enabled synthesizer (CORES); an example is shown in FIG. 9. Such an approach can enable full integration of active and passive components (including control electronics) of a comb-based optical frequency synthesizer on a silicon (Si) chip having dimensions on the centimeter scale. In some implementations, so-called microcomb technology can be employed to realize an arbitrary optical frequency synthesizer controlled by a radio-frequency (RF) electrical reference input.

An example of an inventive dual-comb optical-frequency comb generator is illustrated schematically in FIG. 1 and comprises: (a) a tunable comb-generating laser 101; (b) a coarse-comb generator 300; (c) a fine-comb generator 500; (d) a second harmonic generator 405; (e) a coarse-comb offset photodetector 203; (f) a dual-comb offset photodetector 204; and (g) a fine-comb photodetector 205. The tunable comb-generating laser 101 generates a comb-generating laser signal 71 at an optical frequency $v_p$. In the drawings, optical signals are indicated with solid lines with arrows, while electrical signals are indicated with dashed lines with arrows. The comb-generating laser signal 71 is split into first and second portions 73 and 75, respectively (if needed or desired, amplified by optical amplifiers 103 and 105, respectively). In the drawings, splitting or combining of optical signals is indicated at points where arrows converge or from which they diverge, respectively, and can be achieved in any suitable way, e.g., waveguide or fiber splitters, combiners, or couplers in implementations in which optical signals propagate as optical modes supported by waveguides or fibers, or free-space beamsplitters in implementations in which optical signals propagate as unconfined, free-space optical beams.

The coarse-comb generator 300 receives the first portion 73 of the comb-generating laser signal 71 (amplified by optical amplifier 103 if needed or desired; see below), and generates a coarse optical-frequency comb 83 having optical frequencies $v_N = v_p + N\Delta$ (where N is an integer (positive, negative, or zero) and $\Delta$ is a coarse-comb frequency spacing). The coarse optical-frequency comb 83 spans at least an octave of optical frequency. The fine-comb generator 500 receives a second portion 75 of the comb-generating laser signal 71 (amplified by optical amplifier 105 if needed or desired; see below) and generates a fine optical-frequency comb 85 having optical frequencies $v_{N'} = v_p + N'\Delta'$ (where N' is an integer (positive, negative, or zero) and $\Delta'$ is a fine-comb frequency spacing). The second harmonic generator 405 receives a portion 83b of the coarse optical-frequency comb 83; the portion 83b includes a comb optical signals at optical frequency $v_{N1}$ and can be amplified by optical amplifier 401 (if needed or desired). The second harmonic generator 405 generates from the comb optical signal at $v_{N1}$ a second harmonic optical signal 83b' at optical frequency $2v_{N1}$.

Figure 10:
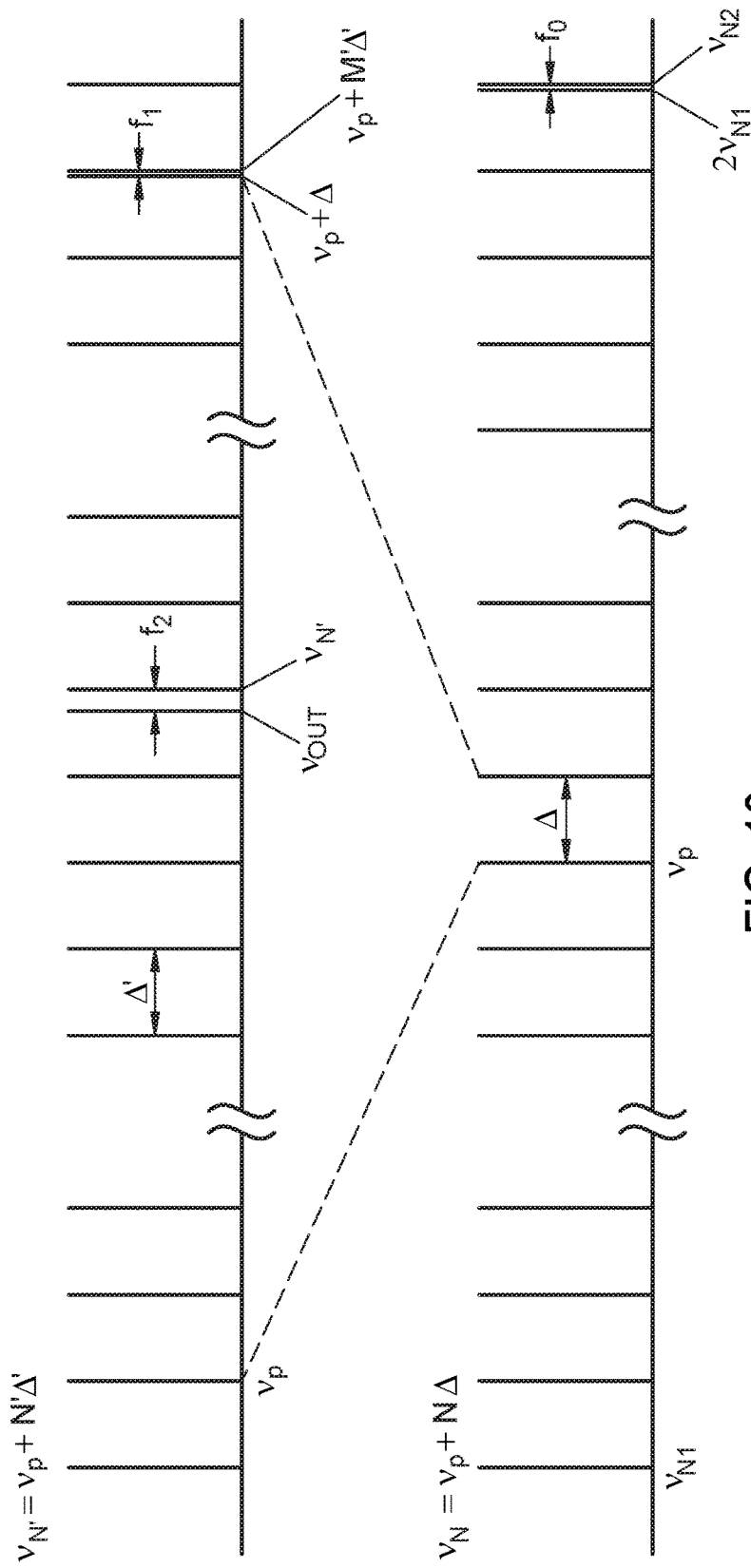
FIG. 10 illustrates schematically the relationships between laser optical frequencies, dual-comb optical frequency spacings, and several offset frequencies.

A coarse-comb offset photodetector 203 receives the second harmonic optical signal 83b', and also receives another portion 83a of the coarse optical-frequency comb 83 that includes a comb optical signal at an optical frequency $v_{N2} \approx 2v_{N1}$. From the optical signals at $v_{N2}$ and $2v_{N1}$, the coarse-comb offset photodetector 203 generates a coarse-comb offset electrical signal 93 at a coarse-comb offset frequency $f_0 = |2v_{N1} - v_{N2}|$ (i.e., the beat note between $2v_{N1}$ and $v_{N2}$; see FIG. 10). A dual-comb offset photodetector 204 receives portions 83c and 85c of the coarse and fine optical-frequency combs 83 and 85, respectively, including comb optical signals at optical frequencies $v_p + \Delta$ and $v_p + M\Delta'$, or $v_p - \Delta$ and $v_p - M\Delta'$ (where M is the positive integer closest to $\Delta/\Delta'$). From those comb optical signals, the dual-comb offset photodetector 204 generates a dual-comb offset electrical signal 94 at a dual-comb offset frequency $f_1 = |\Delta - M\Delta'|$ (i.e., the beat note between $v_p + \Delta$ and $v_p + M\Delta'$; see FIG. 10). The fine-comb photodetector 205 receives a portion 85a of the fine optical-frequency comb 85, and generates a fine-comb-spacing electrical signal 95 at the fine-comb frequency spacing $\Delta'$.

Measurement of the frequencies of the electrical signals 93, 94, and 95 provides measured values for the frequencies $f_0$, $f_1$, and $\Delta'$. In particular, because the coarse optical-frequency comb 83 spans an octave, the frequency $f_0$ represents an absolute phase offset of the coarse-comb frequencies $v_N$ from corresponding pure harmonics (i.e., the coarse comb 83 is self-referencing), and enables a determination (along with measured values of $\Delta'$ and $f_1$) of the optical frequency $v_p$ or the coarse-comb spacing $\Delta$. Knowledge of $v_p$ and $\Delta$ or $\Delta'$ in turn enables determination of the comb frequencies $v_N = v_p + N\Delta$ or $v_{N'} = v_p + N'\Delta'$ and their use as an absolute frequency scale for measurement of other optical frequencies. The dual-comb generator can include one or more electronic processors or circuit elements structured, connected or programmed so as to determine at least $v_p$ using measured values of $\Delta'$, $f_0$, and $f_1$. The one or more electronic processors or circuit elements can be further structured, connected or programmed so as to determine $\Delta$, $v_N$, or $v_{N'}$ using measured values of $\Delta'$, $f_0$, and $f_1$.

If there is any drift or fluctuation of the optical frequency $v_p$ or the comb spacings $\Delta$ or $\Delta'$ (i.e., if those quantities are dynamic, e.g., in response to environmental or mechanical perturbations), there will be corresponding drift or fluctuation of $v_N$ and $v_{N'}$. In some examples that drift or fluctuation can be tolerated, and the values of $v_p$, $v_N$, or $v_{N'}$ can be recalculated using differing measured values of $\Delta'$, $f_0$, and $f_1$ as those values change with time. Alternatively, in some examples, one or more servo controllers can be employed to stabilize one or more of $\Delta$, $\Delta'$, or $v_p$. Any suitable servo controller can be employed; a common implementation includes a phase-locked loop that phase-locks the controlled frequency to a frequency reference. Any suitable frequency reference can be employed including, e.g., frequency references based on one or more of a reference oscillator, an atomic transition, direct digital synthesis, or harmonic frequency multiplication. A common implementation includes a quartz reference oscillator, direct digital synthesis, and harmonic multiplication (if needed) to provide reference electrical signals at one or more selected reference frequencies.

Figure 2:
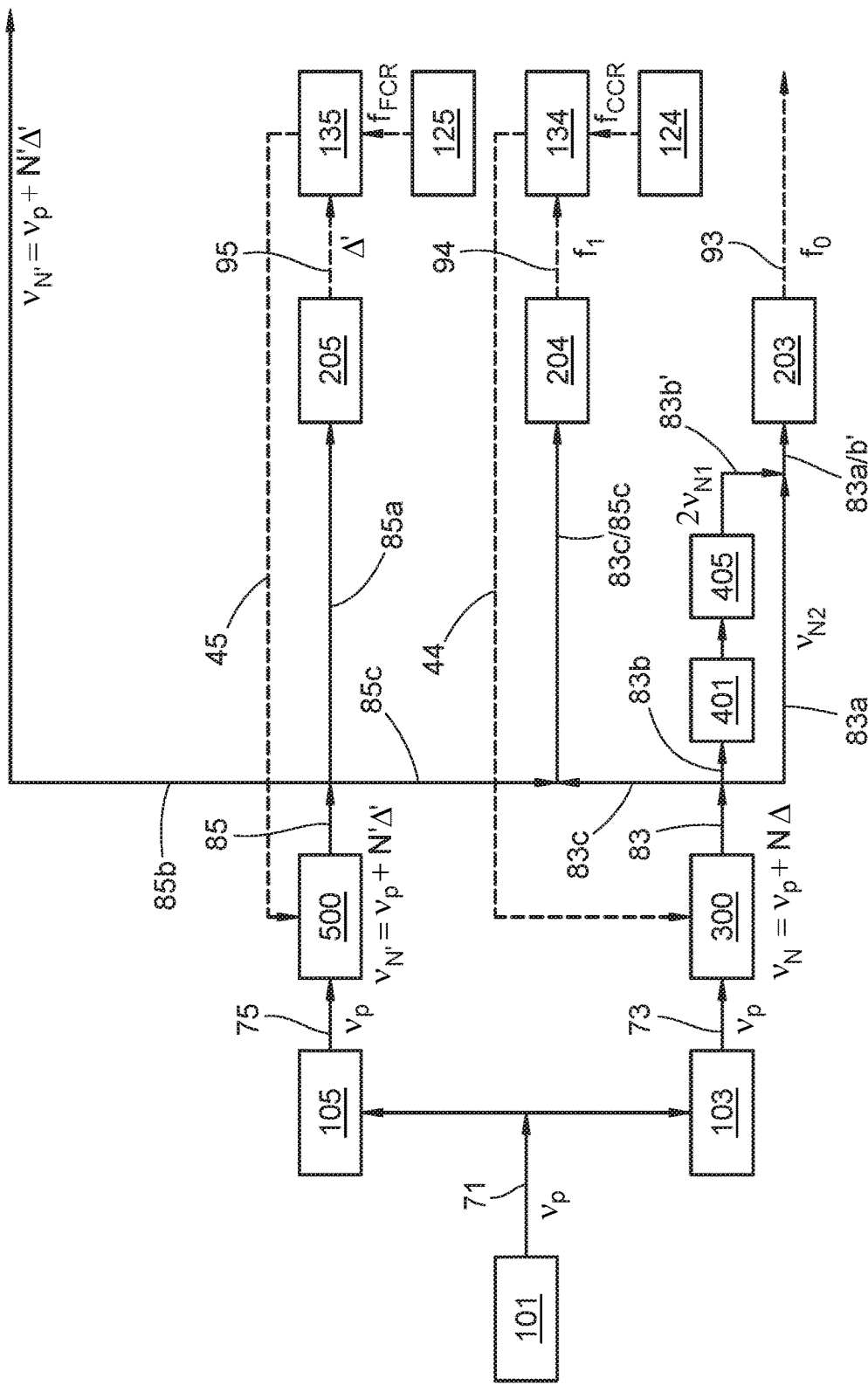
FIG. 2 illustrates schematically the example of FIG. 1 with servo control of the dual-comb optical frequency spacings.
Figure 3:
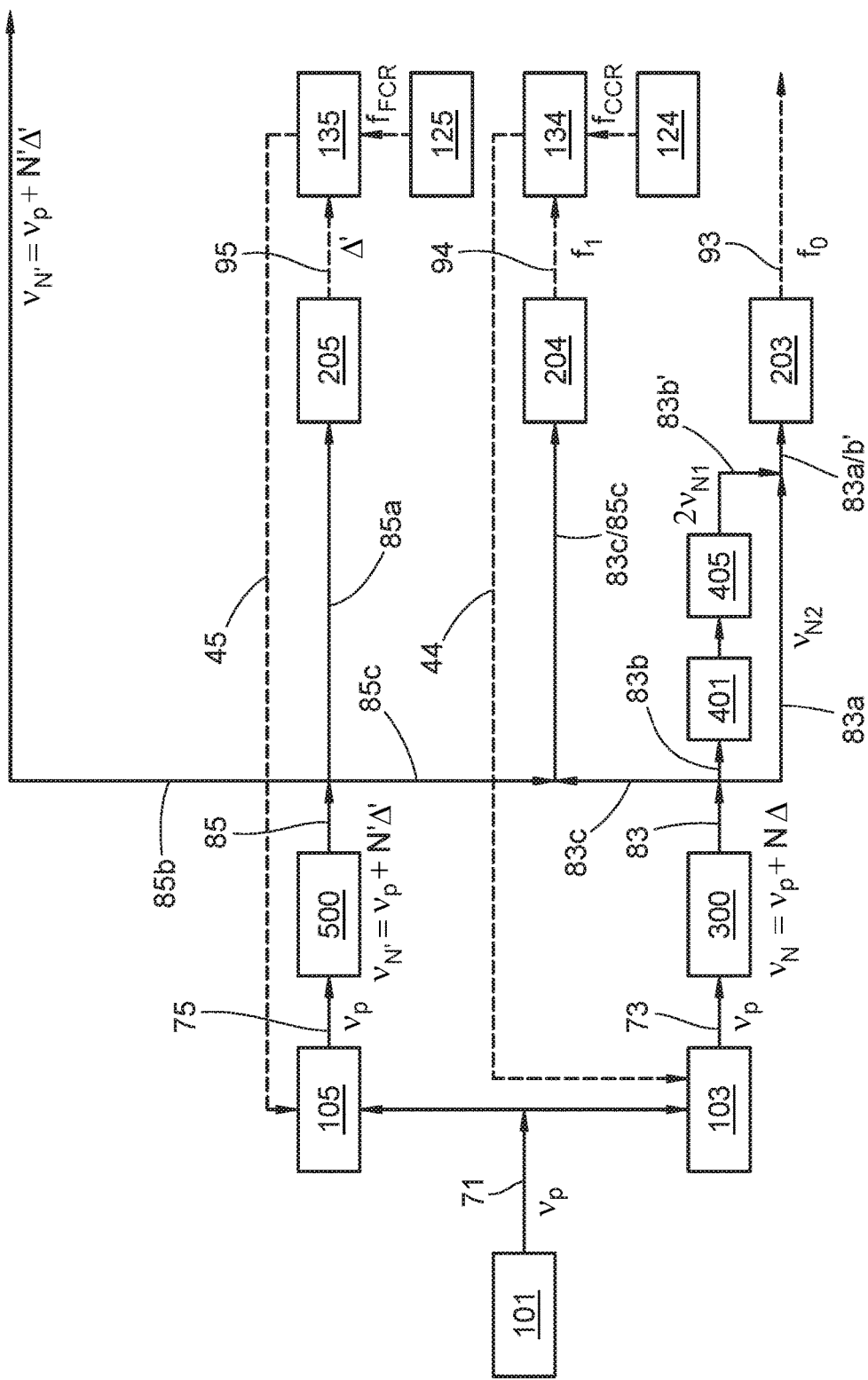
FIG. 3 illustrates schematically the example of FIG. 1 with servo control of the comb optical frequency spacings.
Figure 4:
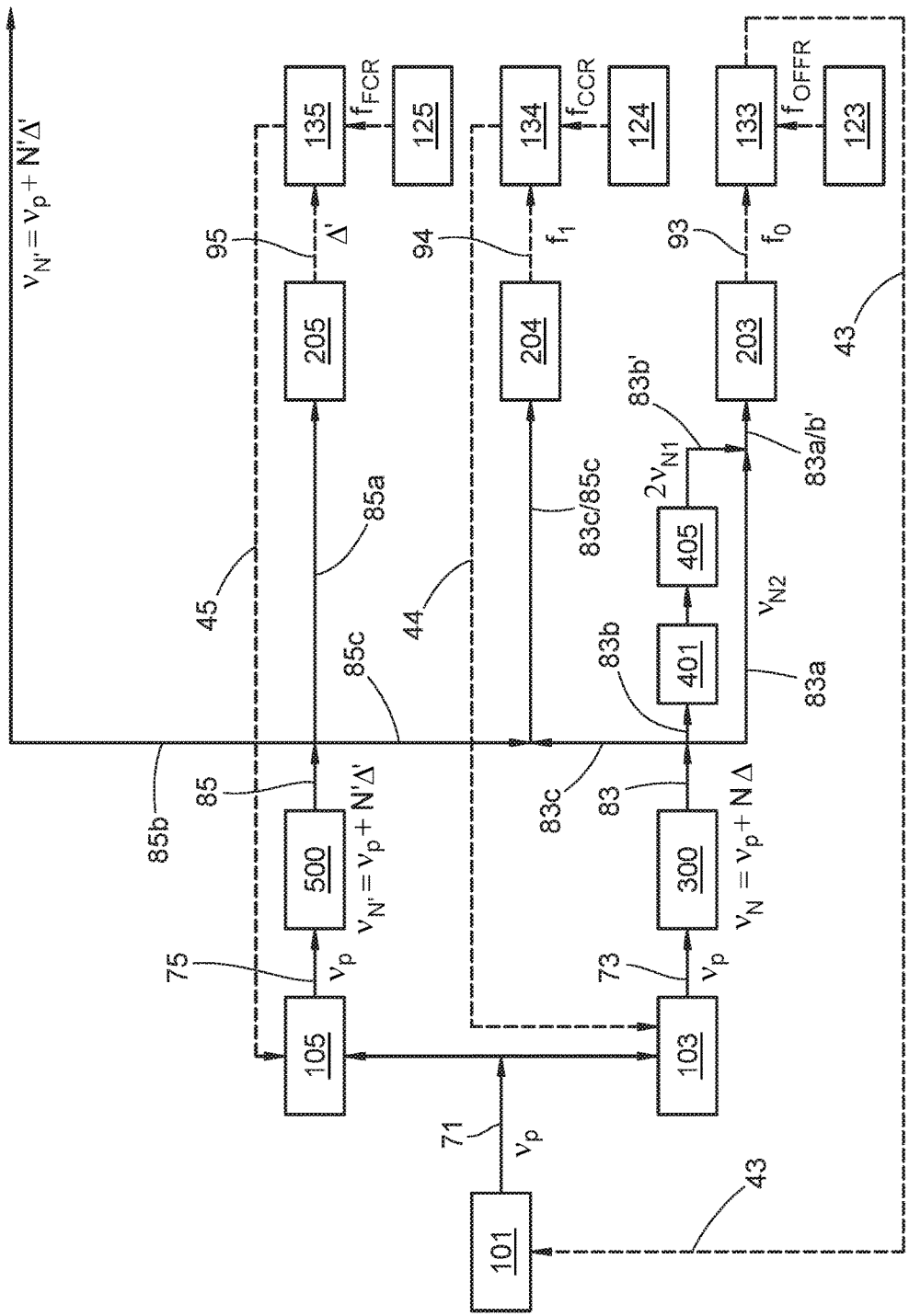
FIG. 4 illustrates schematically the example of FIG. 3 with servo control of a comb-generating laser optical frequency.
Figure 5:
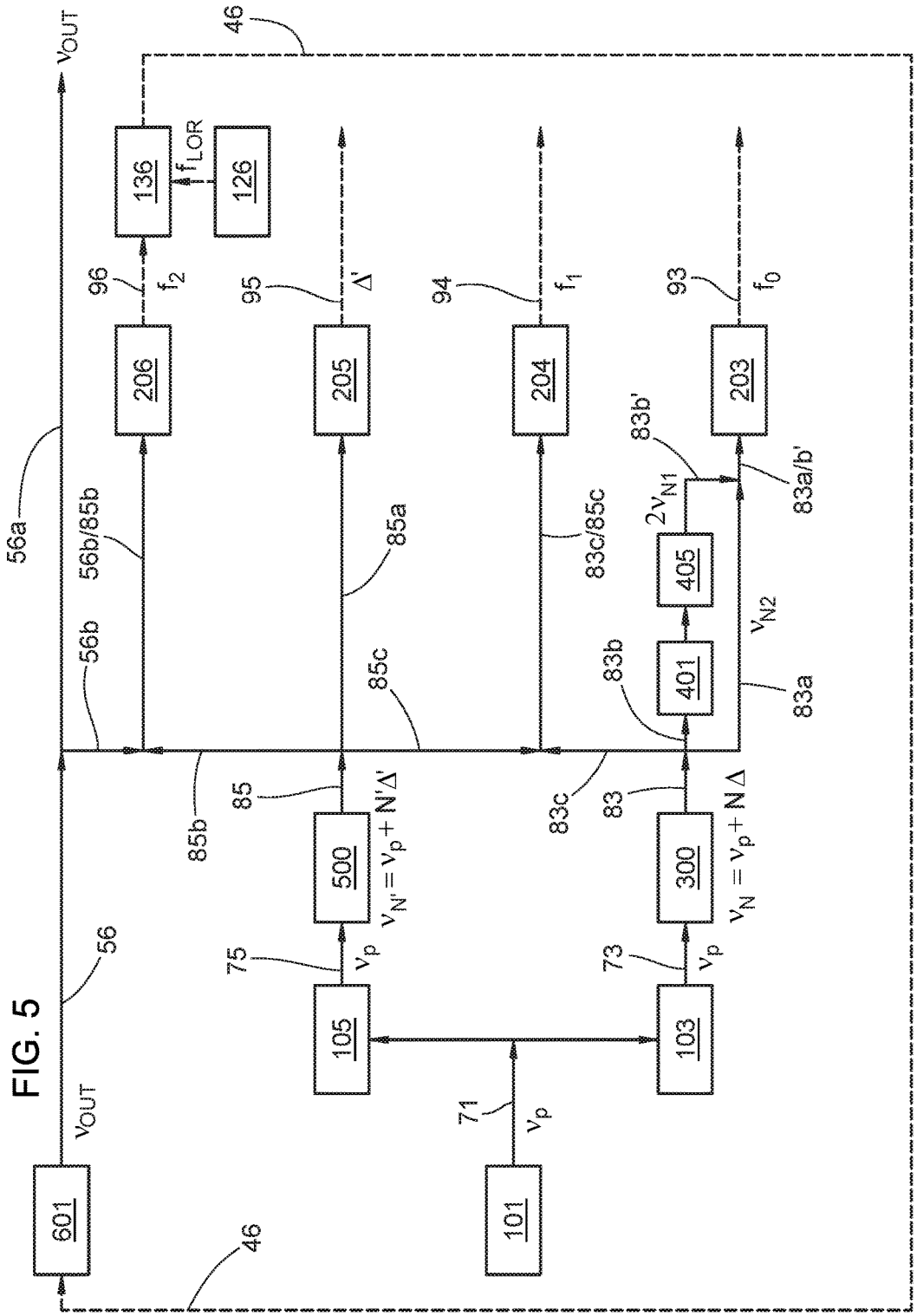
FIG. 5 illustrates schematically an example of an inventive dual optical frequency comb generator coupled to an output laser for selection, measurement, or control of an output laser optical frequency.
Figure 6:
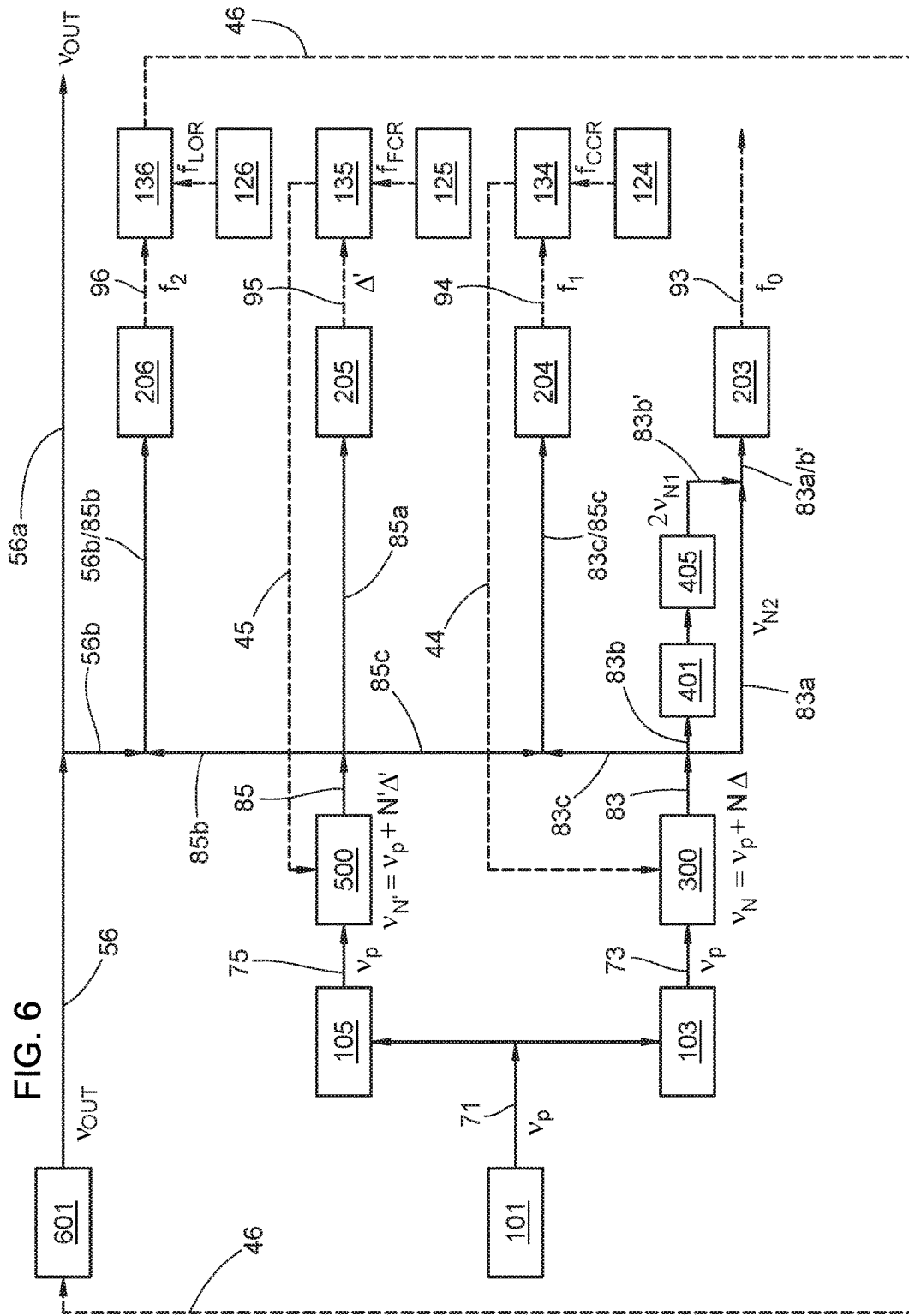
FIG. 6 illustrates schematically the example of FIG. 5 with servo control of the dual-comb optical frequency spacings.
Figure 7:
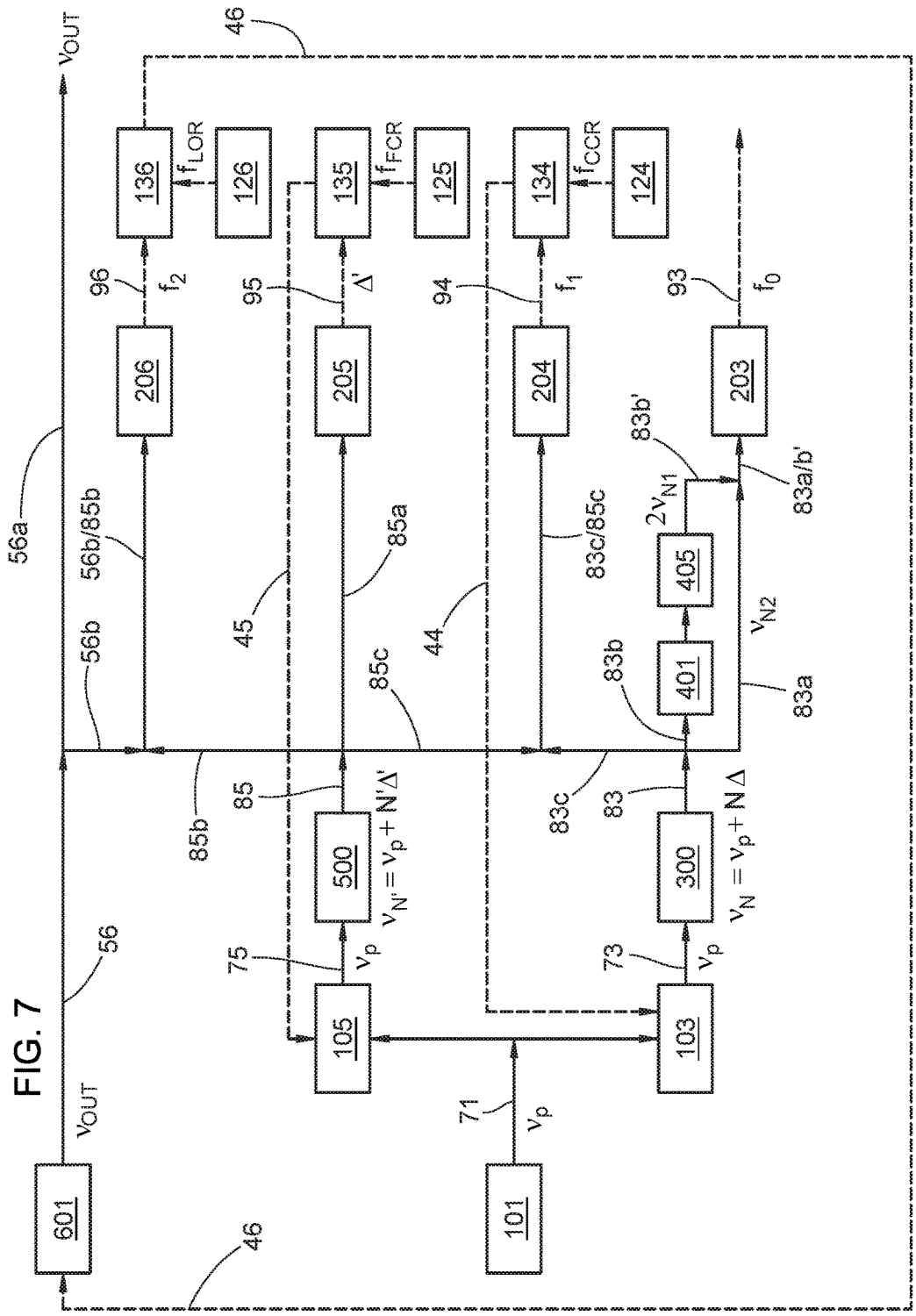
FIG. 7 illustrates schematically the example of FIG. 5 with servo control of the dual-comb optical frequency spacings.
Figure 8:
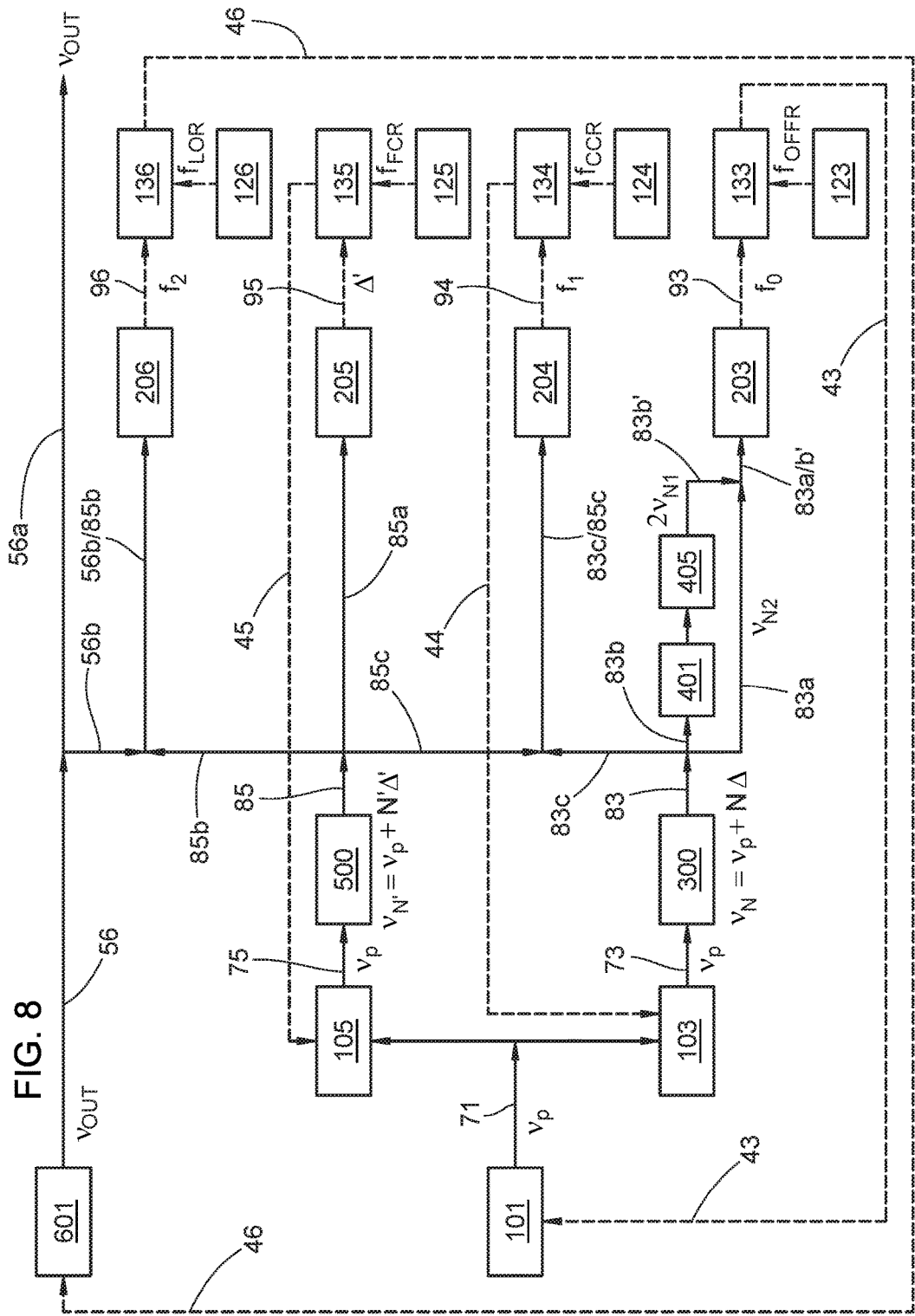
FIG. 8 illustrates schematically the example of FIG. 3 with servo control of a comb-generating laser optical frequency.

In the examples of FIGS. 2 and 3, the dual-comb generator includes a coarse-comb servo controller 134 (of any suitable type; often including a phase-locked loop) coupled to the coarse-comb generator 300 (FIG. 2) or optical amplifier 103 (FIG. 3; discussed further below) and a fine-comb servo controller 135 (of any suitable type; often including a phase-locked loop) coupled to the fine-comb generator 500 (FIG. 2) or optical amplifier 105 (FIG. 3; discussed further below). The fine-comb servo controller 135 is structured and connected so as to control $\Delta'$ (via a servo control electrical signal 45) based on an error signal that is a difference between $\Delta'$ and a frequency $f_{FCR}$ of a fine-comb reference electrical signal provided by the frequency reference 125. The coarse-comb servo controller 134 is structured and connected so as to control $\Delta$ (via a servo control electrical signal 44) based on an error signal that is a difference between $f_1$ and a frequency $f_{CCR}$ of a coarse-comb reference electrical signal provided by the frequency reference 124. In some examples, the frequency references 124 and 125 can be different output frequencies derived from a common reference oscillator, as described above. The example of FIG. 4 further includes a coarse-comb-offset servo controller 133 (of any suitable type; often including a phase-locked loop) coupled to the comb-generating laser 101. The coarse-comb-offset servo controller 133 is structured and connected so as to control $v_p$ (via a servo control electrical signal 43) based on an error signal that is a difference between $f_0$ and a frequency $f_{OFFR}$ of a coarse-comb-offset reference electrical signal provided by the frequency reference 123. In some examples, the frequency reference 123 can be yet another output frequency derived from the same reference oscillator as those of frequency references 124 and 125. In some examples, the coarse-comb generator 300 and the fine-comb generator 500 are structured and arranged so that each one of $f_0$, $f_1$, and $\Delta'$ is less than about 100 GHz; in some examples, the coarse-comb generator 300 and the fine-comb generator 500 are structured and arranged so that each one of $f_0$, $f_1$, and $\Delta'$ is less than about 25 GHz; in some examples, the coarse-comb generator 300 and the fine-comb generator 500 are structured and arranged so that each one of $f_0$, $f_1$, and $\Delta'$ is less than about 10 GHz.

Any suitable type of comb generator can be employed for each one of the comb generators 300 and 500. In some examples, the coarse-comb generator 300 comprises an optical resonator; in some examples the fine-comb generator 500 comprises an optical resonator. Any suitable linear or ring optical resonator can be employed. In some examples, the optical resonator comprises a disk, microdisk, ring, or microring resonator on a substrate; evanescent optical coupling with a waveguide or optical fiber typically is employed to couple optical signals into and out of such resonators. In some of those examples, the substrate comprises one or more semiconductors, and the first or second optical resonator comprises one or more semiconductors, one or more metal or semiconductor oxides, one or more metal or semiconductor nitrides, or one or more metal or semiconductor oxynitrides. In some specific examples, the optical resonator of the coarse-comb generator 300 comprises a silicon nitride ring or microring resonator on a silicon substrate, and the optical resonator of the fine-comb generator 500 comprises a disk, microdisk, ring, or microring resonator on the same silicon substrate. In any of the resonator example, any suitable mechanism can be exploited for generating the coarse or fine optical-frequency combs, e.g., Kerr effect, four-wave mixing, parametric oscillation, and so on. In some examples, instead of a resonator, the fine-comb generator 500 can comprise a modelocked laser having a pulse repetition frequency about equal to $\Delta'$ or a phase modulator sideband generator operated at a modulation frequency about equal to $\Delta'$.

In some examples, $v_p$ is between about 100 THz and about 800 THz, $\Delta$ is between about 0.2 THz and about 10 THz, and $\Delta'$ is between about 1.0 GHz and about 100 GHz. In some examples, $v_p$ is between about 180 THz and about 200 THz, $\Delta$ is between about 0.5 THz and about 2 THz, and $\Delta'$ is between about 5 GHz and about 20 GHz. In some examples (e.g., FIG. 9), $v_p$ is about 194±4 THz (i.e., output wavelength tunable from about 1515 nm to about 1580 nm), $\Delta$ is about 1.0 THz, and $\Delta'$ is about 15 GHz. The optical frequency $v_p$ and the coarse-comb spacing $\Delta$ should be chosen so that the generated coarse comb spans an octave of optical frequency, thus enabling self-referencing as described above.

In examples wherein the coarse-comb generator 300 comprises an optical resonator, and the coarse-comb servo controller 134 can be structured and connected to effect control of $\Delta$ (via the servo control electrical signal 44) by thermal tuning of the optical resonator. In some examples (FIG. 2) the thermal tuning is direct, e.g., using a heating or cooling element on or near the resonator. In other examples (FIG. 3) the thermal tuning is indirect; the thermal tuning can be effected by controlling the optical amplifier 103 to control the power level of the portion 73 of the comb-generating laser signal 71. The temperature of the resonator (and therefore $\Delta$) changes in response to varying levels of optical power coupled into the resonator.

Similarly, in examples wherein the fine-comb generator 500 comprises an optical resonator, and the fine-comb servo controller 135 can be structured and connected to effect control of $\Delta'$ (via the servo control electrical signal 45) by thermal tuning of the optical resonator. In some examples (FIG. 2) the thermal tuning is direct, e.g., using a heating or cooling element on or near the resonator. In other examples (FIG. 3) the thermal tuning is indirect; the thermal tuning can be effected by controlling the optical amplifier 105 to control the power level of the portion 75 of the comb-generating laser signal 71. The temperature of the resonator (and therefore $\Delta'$) changes in response to varying levels of optical power coupled into the resonator. In some examples one or both of the optical amplifiers 103 or 105 are semiconductor optical amplifiers on a substrate. In some of those examples, each semiconductor optical amplifier 103 or 105 can include one or more III-V semiconductor materials, and the substrate can include one or more silicon-based semiconductor materials.

In some examples, the second harmonic generator 405 includes one or more nonlinear optical materials that exhibit second-order optical nonlinearity; the one or more nonlinear optical materials are arranged so as to generate from the optical signal at $v_{N1}$ the second harmonic optical signal at $2v_{N1}$. In some examples, the one or more nonlinear optical materials include one or more crystalline materials, one or more periodically poled materials, one or more thin film materials, or one or more nonlinear optical materials incorporated into a waveguide. In one of a specific example, the second harmonic generator 405 includes a periodically poled lithium niobate film on a silicon nitride waveguide on a silicon substrate. To provide sufficient optical signal strength at the frequency $2v_{N1}$, an optical amplifier 401 can be employed to amplify the comb optical signal at $v_{N1}$. In examples wherein the second harmonic generator 405 is formed in or on a waveguide on a semiconductor substrate, the optical amplifier 401 can comprise a semiconductor optical amplifier (SOA) formed in or on a preceding segment of that waveguide.

Linearity and saturation are photodetector parameters relevant to adequate performance as photodetectors 203/204/205. Any saturation or nonlinearity affects the spectral characteristics of the signals generated, to the possible detriment of overall performance of the dual-comb generator. In some examples, each one of the photodiodes 203/204/205 comprises a waveguide photodiode on a substrate. In some of those examples, each photodiode comprises a modified uni-traveling carrier waveguide photodiode on a silicon-on-insulator substrate.

Any suitable type of laser can be employed for the comb-generating laser 101. If servo control of the optical frequency $v_p$ is employed, then the servo control electrical signal 43 can be coupled to the laser 101 to effect tuning of $v_p$, e.g., by heating or cooling the laser 101, by altering the laser drive current, or by controlling a tuning element of the laser 101. In some examples, the comb-generating laser 101 is a tunable semiconductor laser on a substrate. In some of those examples, the comb-generating laser 101 includes one or more III-V semiconductor materials, and the substrate includes one or more silicon-based semiconductor materials. In some examples, the comb-generating laser 101 includes two or more ring optical resonators coupled thereto and arranged so as to effect tuning of the laser by tuning of respective reflectance spectra of the coupled ring optical resonators (e.g., by so-called Vernier effect tuning). Tuning of $v_p$ can be effected by thermal tuning of the resonators coupled to the laser 101 (via the servo control signal 43, if servo control of the optical frequency $v_p$ is employed).

An inventive tunable laser source (examples shown in FIGS. 5 through 9) includes the dual-comb generator (in any of its forms described above) and further includes a tunable output laser 601 and an output offset photodetector 206. Any suitable type of laser can be employed for laser 601, including any of the types described above for laser 101. Any suitable type of photodetector can be employed for photodetector 206, including those described above for photodetectors 203/204/205. The tunable output laser generates an output laser signal 56 at an output optical frequency $v_{OUT}$. The output offset photodetector 206 receives a portion 56b of the output laser signal 56 and at least a portion 85b of the fine optical frequency comb 85. The portion 85b includes a comb optical signal at an optical frequency $v_N$. The photodetector 206 generates from the comb optical signal 85b and the output laser signal 56b an output offset electrical signal 96 at an output offset frequency $f_2=|v_{OUT}-v_{N'}|$ (i.e., the beat note between $v_{OUT}$ and $v_{N'}$; see FIG. 10). In some examples, the laser source can include one or more electronic processors or circuit elements structured, connected or programmed so as to determine the optical output frequency $v_{OUT}$ using measured values of $\Delta'$, $f_0$, $f_1$, and $f_2$.

In some examples, the laser source can include a laser output servo controller 136 coupled (via a servo control electrical signal 46) to the output laser 601. The laser 601 can be adapted in any suitable way to enable laser tuning in response to the servo control signal 46, including those described above for tuning the laser 101 in response to the servo control signal 43. The laser output servo controller 136 is structured and connected so as to control $v_{OUT}$ based on an error signal that is a difference between $f_2$ and a frequency $f_{LOR}$ of a laser-output reference electrical signal provided by the frequency reference 126. The frequency reference 126 can be of any suitable type or arrangement, including those described above for frequency references 123/124/125. In some examples, the frequency reference 126 can be yet another output frequency derived from the same reference oscillator as those of frequency references 123/124/125. In some examples, the output optical frequency $v_{OUT}$ can be tuned or selected by tuning or selecting the laser output reference frequency $f_{LOR}$. The servo controller 136 forces $v_{OUT}$ to track $f_{LOR}$ as $f_{LOR}$ changes (assuming $v_{N'}$ is constant). To enable broad tuning of $v_{OUT}$ across the optical frequency range spanned by the fine optical frequency comb, the laser output servo controller 136 can be structured and connected to shift from one fine-comb frequency $v_{N'}$ to another fine-comb line at, e.g., $v_{N'\pm 1}$, to limit the size of $f_{LOR}$ required to achieve the desired tuning.

However, as described above, in the absence of servo control, $v_p$, $v_N$, and $v_{N'}$ are dynamic, i.e., their values can drift or fluctuate. Drift or fluctuation of $v_{N1'}$ results in similar drift or fluctuation of $v_{OUT}$ if $f_{LOR}$ is constant. In some examples (e.g., FIG. 5), the laser output servo controller 136 can be structured and connected to tune the optical output frequency $v_{OUT}$ to a selected output optical frequency $v_{SEL}$, or maintain $v_{OUT}$ at $v_{SEL}$, in response to tuning or variation of $f_{LOR}$, according to a calibrated dependence of $v_{OUT}$ on $f_{LOR}$ for specific measured values of one or more of $f_0$, $f_1$, or $\Delta'$. In other words, drift or fluctuation of $f_0$, $f_1$, or $\Delta'$ is tolerated, and for a given set of measured values of $f_0$, $f_1$, or $\Delta'$, a corresponding $f_{LOR}$ can be calculated that causes $v_{OUT}$ to assume the desired value $v_{SEL}$. That calculation can be repeated as the values of $f_0$, $f_1$, or $\Delta'$ change with time (changing the dependence of $v_{OUT}$ on $f_{LOR}$), or as the laser source is tuned (i.e., as $v_{SEL}$ changes with time in some intentional way).

Alternatively, in some examples (e.g., FIG. 6 through 9), one or more of servo controllers 133/134/135 can be employed as described above for maintaining one or more of $f_0$, $f_1$, or $\Delta'$, respectively, substantially constant at corresponding selected values. In that case, the laser output servo controller 136 can be structured and connected to tune the optical output frequency $v_{OUT}$ to a selected output optical frequency $v_{SEL}$, or maintain $v_{OUT}$ at $v_{SEL}$, in response to tuning or control of $f_{LOR}$ according to a calibrated dependence of $v_{OUT}$ on $f_{LOR}$ (for the selected, substantially constant values of one or more of $f_0$, $f_1$, or $\Delta'$) that remains substantially constant.

In some examples, the comb-generating laser 101, the coarse-comb generator 103, the fine-comb generator 105, the second harmonic generator, 405, each photodetector 203/204/205 and 206 (if present), the output laser 601 (if present), and each optical amplifier (if present) is integrated onto a common substrate. In some of those examples, the substrate is silicon and one or more of the laser(s) or amplifier(s) includes one or more III-V semiconductors. In some examples, each electronic processor or circuit element (if present) and each servo controller 123/124/125/126 (if present) is integrated onto the common substrate. In some examples, each frequency reference 123/124/125/126 (if present) is integrated onto the common substrate.

In examples implemented on a substrate, any one or more suitable materials can be employed for the substrate, ring optical resonators, or optical waveguides. In some examples, (i) the substrate can include one or more semiconductors, (ii) the ring optical resonators can include one or more semiconductors, one or more metal or semiconductor oxides, one or more metal or semiconductor nitrides, or one or more metal or semiconductor oxynitrides, and (iii) the optical waveguides can include one or more semiconductors, one or more metal or semiconductor oxides, one or more metal or semiconductor nitrides, or one or more metal or semiconductor oxynitrides. For purposes of the present disclosure or appended claims: (i) "one or more semiconductors" can denote single-element semiconductor materials (e.g., silicon or germanium) or multiple-element semiconductor materials (e.g., GaAs, InP, or other III-V materials), and can also denote doped or undoped semiconductor materials; (ii) "one or more metal or semiconductor oxides" can include one or more doped or undoped oxide materials; and (iii) "one or more metal or semiconductor nitrides or oxynitrides" can include one or more doped or undoped nitride or oxynitride materials.

Dual-comb generator apparatus and methods disclosed herein can provide known, stable fine-comb optical frequencies, to serve as an absolute reference for selection or control of other optical signals. Use of an output laser and control of that laser using the dual-comb generator enables so-called optical frequency synthesis, wherein adjustment of one or more output frequencies of an RF or microwave frequency source (to select one or more of the output frequencies of the frequency references 123/124/125/126) enables nearly arbitrary selection of a laser output frequency $v_{OUT}$ within the range of the fine-comb optical frequencies. That optical frequency capability can be provided on a centimeter-scale integrated semiconductor device. Those fine-comb frequencies and output frequency can all be related back to a common reference oscillator or atomic transition, if needed or desired.

In addition to the preceding, the following examples fall within the scope of the present disclosure or appended claims:

Example 1

An apparatus comprising: (a) a tunable comb-generating laser that generates a comb-generating laser signal at an optical frequency $v_p$; (b) a coarse-comb generator structured and arranged so as to receive a first portion of the comb-generating laser signal and to generate therefrom a coarse optical-frequency comb having optical frequencies $v_N=v_p+N\Delta$ where N is an integer and $\Delta$ is a coarse-comb frequency spacing, wherein the coarse optical-frequency comb spans at least an octave of optical frequency; (c) a fine-comb generator structured and arranged so as to receive a second portion of the comb-generating laser signal and to generate therefrom a fine optical-frequency comb having optical frequencies $v_{N'}=v_p+N'\Delta'$ where N' is an integer and $\Delta'$ is a fine-comb frequency spacing; (d) a second harmonic generator structured and arranged so as to (i) receive at least a portion of the coarse optical-frequency comb, including a comb optical signals at an optical frequency $v_{N1}$, and (ii) generate from the comb optical signal at $v_{N1}$ a second harmonic optical signal at an optical frequency $2v_{N1}$; (e) a coarse-comb offset photodetector structured and arranged so as to (i) receive the second harmonic optical signal, (ii) receive at least a portion of the coarse optical-frequency comb, including a comb optical signal at an optical frequency $v_{N2} \approx 2v_{N1}$, and (iii) generate, from the comb optical signal at $v_{N2}$ and the second harmonic optical signal at $2v_{N1}$, a coarse-comb offset electrical signal at a coarse-comb offset frequency $f_0 = |2v_{N1} - v_{N2}|$; (f) a dual-comb offset photodetector structured and arranged so as to (i) receive at least portions of the coarse and fine optical-frequency combs, including comb optical signals at optical frequencies $v_p + \Delta$ and $v_p + M\Delta'$, or $v_p - \Delta$ and $v_p - M\Delta'$, where M is a positive integer closest to $\Delta/\Delta'$, and (ii) generate from the comb optical signals a dual-comb offset electrical signal at a dual-comb offset frequency $f_1 = |\Delta - M\Delta'|$; and (g) a fine-comb photodetector structured and arranged so as to (i) receive at least portions of the fine optical-frequency comb, and (ii) generate from the fine optical-frequency comb a fine-comb-spacing electrical signal at the fine-comb frequency spacing $\Delta'$.

Example 2

The apparatus of Example 1 further comprising: (H) a tunable output laser that generates an output laser signal at an output optical frequency $v_{OUT}$; and (I) an output offset photodetector structured and arranged so as to (i) receive at least a portion of the fine optical-frequency comb at an optical frequency $v_{N'}$ and at least a portion of the output laser signal, and (ii) generate, from the received portion of the fine optical-frequency comb at the optical frequency $v_{N'}$ and the received portion of the output laser signal, an output offset electrical signal at an output offset frequency $f_2 = |v_{OUT} - v_{N'}|$.

Example 3

The apparatus of any one of Examples 1 or 2 further comprising one or more electronic processors or circuit elements structured, connected or programmed so as to determine the optical frequency $v_p$ using measured values of $\Delta'$, $f_0$, and $f_1$.

Example 4

The apparatus of any one of Examples 1 through 3 further comprising one or more electronic processors or circuit elements structured, connected or programmed so as to determine the coarse-comb frequency spacing $\Delta$ using measured values of $\Delta'$, $f_0$, and $f_1$.

Example 5

The apparatus of any one of Examples 1 through 4 further comprising a coarse-comb servo controller coupled to the coarse-comb generator and a fine-comb servo controller coupled to the fine-comb generator, wherein (i) the fine-comb servo controller is structured and connected so as to control $\Delta'$ based on an error signal that is a difference between $\Delta'$ and a frequency $f_{FCR}$ of a fine-comb reference electrical signal, and (ii) the coarse-comb servo controller is structured and connected so as to control $\Delta$ based on an error signal that is a difference between $f_1$ and a frequency $f_{CCR}$ of a coarse-comb reference electrical signal.

Example 6

The apparatus of any one of Examples 1 through 5 further comprising a coarse-comb-offset servo controller coupled to the comb-generating laser, the coarse-comb-offset servo controller is structured and connected so as to control $v_p$ based on an error signal that is a difference between $f_0$ and a frequency $f_{OFFR}$ of a coarse-comb-offset reference electrical signal.

Example 7

The laser source of any one of Examples 2 through 6 further comprising one or more electronic processors or circuit elements structured, connected or programmed so as to determine the optical output frequency $v_{OUT}$ using measured values of $\Delta'$, $f_0$, $f_1$, and $f_2$.

Example 8

The laser source of any one of Examples 2 through 7 further comprising a laser output servo controller coupled to the output laser, wherein the laser output servo controller is structured and connected so as to control $v_{OUT}$ based on an error signal that is a difference between $f_2$ and a frequency $f_{LOR}$ of a laser-output reference electrical signal.

Example 9

The laser source of Example 8 wherein the laser output servo controller is structured and connected to tune the optical output frequency $v_{OUT}$ in response to tuning of $f_{LOR}$.

Example 10

The laser source of any one of Examples 8 or 9 wherein (i) the laser source further comprises one or more corresponding servo controllers coupled to one or more of the comb-generating laser, the coarse-comb generator, or the fine-comb generator for maintaining one or more of $f_0$, $f_1$, or $\Delta'$, respectively, substantially constant at corresponding selected values, and (ii) the laser output servo controller is structured and connected to tune the optical output frequency $v_{OUT}$ to a selected output optical frequency $v_{SEL}$, or maintain $v_{OUT}$ at $v_{SEL}$, in response to tuning or control of $f_{LOR}$ according to a calibrated dependence of $v_{OUT}$ on $f_{LOR}$ for the selected values of one or more of $f_0$, $f_1$, or $\Delta'$.

Example 11

The laser source of any one of Examples 8 or 9 wherein the laser output servo controller is structured and connected to tune the optical output frequency $v_{OUT}$ to a selected output optical frequency $v_{SEL}$, or maintain $v_{OUT}$ at $v_{SEL}$, in response to tuning or variation of $f_{LOR}$, according to a calibrated dependence of $v_{OUT}$ on $f_{LOR}$ for measured values of one or more of $f_0$, $f_1$, or $\Delta'$.

Example 12

The apparatus of any one of Examples 5 through 11 wherein (i) the coarse-comb generator comprises a first optical resonator, and the coarse-comb servo controller is structured and connected to effect control of $\Delta$ by thermal tuning of the first optical resonator, or (ii) the fine-comb generator comprises a second optical resonator, and the fine-comb servo controller is structured and connected to effect control of $\Delta'$ by thermal tuning of the second optical resonator.

Example 13

The apparatus of Example 12 wherein (i) thermal tuning of the first optical resonator is effected by controlling a first optical amplifier arranged to control a power level of the first portion of the comb-generating laser signal, or (ii) thermal tuning of the second optical resonator is effected by controlling a second optical amplifier arranged to control a power level of the second portion of the comb-generating laser signal.

Example 14

The apparatus of Example 13 wherein each one of the first or second optical amplifiers is a semiconductor optical amplifier on a substrate.

Example 15

The apparatus of Example 14 wherein each semiconductor optical amplifier includes one or more III-V semiconductor materials, and the substrate includes one or more silicon-based semiconductor materials.

Example 16

The laser source of any one of Examples 8 through 15 further comprising an electronic frequency source structured, arranged, and connected so as to generate the laser-output reference electrical signal at the frequency $f_{LOR}$ using one or more of a reference oscillator, an atomic transition, direct digital synthesis, or harmonic frequency multiplication.

Example 17

The apparatus of Examples 5 through 16 further comprising an electronic frequency source structured, arranged, and connected so as to generate one or more of the reference electrical signals at the frequencies $f_{OFFR}$, $f_{FCR}$, or $f_{CCR}$ using one or more of a reference oscillator, an atomic transition, direct digital synthesis, or harmonic frequency multiplication.

Example 18

The apparatus of any one of Examples 1 through 17 wherein the comb-generating laser is a tunable semiconductor laser on a substrate.

Example 19

The apparatus of Example 18 wherein the comb-generating laser includes one or more III-V semiconductor materials, and the substrate includes one or more silicon-based semiconductor materials.

Example 20

The apparatus of any one of Examples 18 or 19 wherein the comb-generating laser includes two or more ring optical resonators coupled thereto and arranged so as to effect tuning of the laser by tuning of respective reflectance spectra of the coupled ring optical resonators.

Example 21

The apparatus of any one of Examples 2 through 20 wherein the output laser is a tunable semiconductor laser on a substrate.

Example 22

The apparatus of Example 21 wherein the output laser includes one or more III-V semiconductor materials, and the substrate includes one or more silicon-based semiconductor materials.

Example 23

The apparatus of any one of Examples 21 or 22 wherein the output laser includes two or more ring optical resonators coupled thereto and arranged so as to effect tuning of the laser by tuning of respective reflectance spectra of the coupled ring optical resonators.

Example 24

The apparatus of any one of Examples 1 through 23 wherein the coarse-comb and fine-comb generators are structured and arranged so that each one of $f_0$, $f_1$, and $\Delta'$ is less than about 25 GHz.

Example 25

The apparatus of any one of Examples 1 through 24 wherein the coarse-comb and fine-comb generators are structured and arranged so that each one of $f_0$, $f_1$, and $\Delta'$ is less than about 10 GHz.

Example 26

The apparatus of any one of Examples 1 through 25 wherein (i) the coarse-comb generator comprises a first optical resonator, or (ii) the fine-comb generator comprises a second optical resonator.

Example 27

The apparatus of Example 26 wherein the first or second optical resonator comprises a disk, microdisk, ring, or microring resonator on a substrate.

Example 28

The apparatus of Example 27 wherein the substrate comprises one or more semiconductors, and the first or second optical resonator comprises one or more semiconductors, one or more metal or semiconductor oxides, one or more metal or semiconductor nitrides, or one or more metal or semiconductor oxynitrides.

Example 29

The apparatus of Example 28 wherein the first optical resonator comprises silicon nitride, the second optical resonator comprises silica, and the substrate comprises silicon.

Example 30

The apparatus of any one of Examples 1 through 29 wherein $v_p$ is between about 100 THz and about 800 THz, $\Delta$ is between about 0.2 THz and about 10 THz, and $\Delta'$ is between about 1.0 GHz and about 100 GHz.

Example 31

The apparatus of Example 30 wherein $v_p$ is between about 180 THz and about 200 THz, $\Delta$ is between about 0.5 THz and about 2 THz, and $\Delta'$ is between about 5 GHz and about 20 GHz.

Example 32

The apparatus of any one of Examples 1 through 31 wherein the fine-comb generator comprises a modelocked laser having a pulse repetition frequency about equal to $\Delta'$ or a phase modulator sideband generator operated at a modulation frequency about equal to $\Delta'$.

Example 33

The apparatus of any one of Examples 1 through 32 wherein the second harmonic generator includes one or more nonlinear optical materials that exhibit second-order optical nonlinearity and are arranged so as to generate from the optical signal at $v_{N1}$ the second harmonic optical signal at $2v_{N1}$.

Example 34

The apparatus of Example 33 wherein the one or more nonlinear optical materials include one or more crystalline materials, one or more periodically poled materials, one or more thin film materials, or one or more nonlinear optical materials incorporated into a waveguide.

Example 35

The apparatus of any one of Examples 33 or 34 wherein the second harmonic generator includes a periodically poled lithium niobate film on a silicon nitride waveguide on a silicon substrate.

Example 36

The apparatus of any one of Examples 1 through 35 wherein each one of the photodetectors comprises a waveguide photodiode on a substrate.

Example 37

The apparatus of Example 36 wherein each photodiode comprises a modified uni-traveling carrier waveguide photodiode on a silicon-on-insulator substrate.

Example 38

The apparatus of any one of Examples 1 through 37 wherein the comb-generating laser, the first and second optical resonators, the second harmonic generator, each photodetector, the output laser (if present), and each optical amplifier (if present) is integrated onto a common substrate.

Example 39

The apparatus of Example 38 wherein each electronic processor or circuit element (if present) and each servo controller (if present) is integrated onto the common substrate.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those sets that may not be explicitly disclosed herein. In addition, for purposes of disclosure, each of the appended dependent claims shall be construed as if written in multiple dependent form and dependent upon all preceding claims with which it is not inconsistent. It should be further noted that the scope of the appended claims does not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if the phrase "at least" were appended after each instance thereof, unless explicitly stated otherwise. For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. An apparatus comprising:
   (a) a tunable comb-generating laser that generates a comb-generating laser signal at an optical frequency $v_p$;
   (b) a coarse-comb generator structured and arranged so as to receive a first portion of the comb-generating laser signal and to generate therefrom a coarse optical-frequency comb having optical frequencies $v_N = v_p + N\Delta$ where N is an integer and $\Delta$ is a coarse-comb frequency spacing, wherein the coarse optical-frequency comb spans at least an octave of optical frequency;
   (c) a fine-comb generator structured and arranged so as to receive a second portion of the comb-generating laser signal and to generate therefrom a fine optical-frequency comb having optical frequencies $v_{N'} = v_p + N'\Delta'$ where N' is an integer and $\Delta'$ is a fine-comb frequency spacing;
   (d) a second harmonic generator structured and arranged so as to (i) receive at least a portion of the coarse optical-frequency comb, including a comb optical signals at an optical frequency $v_{N1}$, and (ii) generate from the comb optical signal at $v_{N1}$ a second harmonic optical signal at an optical frequency $2v_{N1}$;
   (e) a coarse-comb offset photodetector structured and arranged so as to (i) receive the second harmonic optical signal, (ii) receive at least a portion of the coarse optical-frequency comb, including a comb optical signal at an optical frequency $v_{N2} \approx 2v_{N1}$, and (iii) generate, from the comb optical signal at $v_{N2}$ and the second harmonic optical signal at $2v_{N1}$, a coarse-comb offset electrical signal at a coarse-comb offset frequency $f_0 = |2v_{N1} - v_{N2}|$;
   (f) a dual-comb offset photodetector structured and arranged so as to (i) receive at least portions of the coarse and fine optical-frequency combs, including comb optical signals at optical frequencies $v_p + \Delta$ and $v_p + M\Delta'$, or $v_p - \Delta$ and $v_p - M\Delta'$, where M is a positive integer closest to $\Delta/\Delta'$, and (ii) generate from the comb optical signals a dual-comb offset electrical signal at a dual-comb offset frequency $f_1 = |\Delta - M\Delta'|$; and
   (g) a fine-comb photodetector structured and arranged so as to (i) receive at least portions of the fine optical-frequency comb, and (ii) generate from the fine optical-frequency comb a fine-comb-spacing electrical signal at the fine-comb frequency spacing $\Delta'$.

2. The apparatus of claim 1 further comprising one or more electronic processors or circuit elements structured, connected or programmed so as to determine the optical frequency $v_p$ using measured values of $\Delta'$, $f_0$, and $f_1$.

3. The apparatus of claim 1 further comprising:
   (H) a tunable output laser that generates an output laser signal at an output optical frequency $v_{OUT}$; and
   (I) an output offset photodetector structured and arranged so as to (i) receive at least a portion of the fine optical-frequency comb at an optical frequency $v_{N'}$ and at least a portion of the output laser signal, and (ii) generate, from the received portion of the fine optical-frequency comb at the optical frequency $v_{N'}$ and the received portion of the output laser signal, an output offset electrical signal at an output offset frequency $f_2 = |v_{OUT} - v_{N'}|$.

4. The apparatus of claim 3 further comprising a coarse-comb servo controller coupled to the coarse-comb generator and a fine-comb servo controller coupled to the fine-comb generator, wherein (i) the fine-comb servo controller is structured and connected so as to control $\Delta'$ based on an error signal that is a difference between $\Delta'$ and a frequency $f_{FCR}$ of a fine-comb reference electrical signal, and (ii) the coarse-comb servo controller is structured and connected so as to control $\Delta$ based on an error signal that is a difference between $f_1$ and a frequency $f_{CCR}$ of a coarse-comb reference electrical signal.

5. The apparatus of claim 4 further comprising an electronic frequency source structured, arranged, and connected so as to generate one or both of the reference electrical signals at the frequencies $f_{FCR}$ or $f_{CCR}$ using one or more of a reference oscillator, an atomic transition, direct digital synthesis, or harmonic frequency multiplication.

6. The apparatus of claim 3 further comprising a coarse-comb-offset servo controller coupled to the comb-generating laser, the coarse-comb-offset servo controller is structured and connected so as to control $v_p$ based on an error signal that is a difference between $f_0$ and a frequency $f_{OFFR}$ of a coarse-comb-offset reference electrical signal.

7. The apparatus of claim 6 further comprising an electronic frequency source structured, arranged, and connected so as to generate the reference electrical signal at the frequency $f_{OFFR}$ using one or more of a reference oscillator, an atomic transition, direct digital synthesis, or harmonic frequency multiplication.

8. The laser source of claim 3 further comprising one or more electronic processors or circuit elements structured, connected or programmed so as to determine the optical output frequency $v_{OUT}$ using measured values of $\Delta'$, $f_0$, $f_1$, and $f_2$.

9. The laser source of claim 3 further comprising a laser output servo controller coupled to the output laser, wherein the laser output servo controller is structured and connected so as to control $v_{OUT}$ based on an error signal that is a difference between $f_2$ and a frequency $f_{LOR}$ of a laser-output reference electrical signal.

10. The laser source of claim 9 wherein the laser output servo controller is structured and connected to tune the optical output frequency $v_{OUT}$ in response to tuning of $f_{LOR}$.

11. The laser source of claim 10 wherein (i) the laser source further comprises one or more corresponding servo controllers coupled to one or more of the comb-generating laser, the coarse-comb generator, or the fine-comb generator for maintaining one or more of $f_0$, $f_1$, or $\Delta'$, respectively, substantially constant at corresponding selected values, and (ii) the laser output servo controller is structured and connected to tune the optical output frequency $v_{OUT}$ to a selected output optical frequency $v_{SEL}$, or maintain $v_{OUT}$ at $v_{SEL}$, in response to tuning or control of $f_{LOR}$ according to a calibrated dependence of $v_{OUT}$ on $f_{LOR}$ for the selected values of one or more of $f_0$, $f_1$, or $\Delta'$.

12. The apparatus of claim 9 wherein (i) the coarse-comb generator comprises a first optical resonator, and the coarse-comb servo controller is structured and connected to effect control of $\Delta$ by thermal tuning of the first optical resonator, or (ii) the fine-comb generator comprises a second optical resonator, and the fine-comb servo controller is structured and connected to effect control of $\Delta'$ by thermal tuning of the second optical resonator.

13. The apparatus of claim 12 wherein (i) thermal tuning of the first optical resonator is effected by controlling a first optical amplifier arranged to control a power level of the first portion of the comb-generating laser signal, or (ii) thermal tuning of the second optical resonator is effected by controlling a second optical amplifier arranged to control a power level of the second portion of the comb-generating laser signal.

14. The laser source of claim 9 further comprising an electronic frequency source structured, arranged, and connected so as to generate the laser-output reference electrical signal at the frequency $f_{LOR}$ using one or more of a reference oscillator, an atomic transition, direct digital synthesis, or harmonic frequency multiplication.

15. The apparatus of claim 3 wherein one or both of the comb-generating laser or the output laser are tunable semiconductor lasers on a substrate.

16. The apparatus of claim 15 wherein the comb-generating laser or the output laser includes two or more ring optical resonators coupled thereto and arranged so as to effect tuning of the corresponding laser by tuning of respective reflectance spectra of the coupled ring optical resonators.

17. The apparatus of claim 3 wherein the coarse-comb and fine-comb generators are structured and arranged so that each one of $f_0$, $f_1$, and $\Delta'$ is less than about 25 GHz.

18. The apparatus of claim 3 wherein (i) the coarse-comb generator comprises a first optical resonator, or (ii) the fine-comb generator comprises a second optical resonator.

19. The apparatus of claim 18 wherein the first or second optical resonator comprises a disk, microdisk, ring, or microring resonator on a substrate.

20. The apparatus of claim 19 wherein the substrate comprises one or more semiconductors, and the first or second optical resonator comprises one or more semiconductors, one or more metal or semiconductor oxides, one or more metal or semiconductor nitrides, or one or more metal or semiconductor oxynitrides.

21. The apparatus of claim 3 wherein $v_p$ is between about 100 THz and about 800 THz, $\Delta$ is between about 0.2 THz and about 10 THz, and $\Delta'$ is between about 1.0 GHz and about 100 GHz.

22. The apparatus of claim 3 wherein $v_p$ is between about 180 THz and about 200 THz, $\Delta$ is between about 0.5 THz and about 2 THz, and $\Delta'$ is between about 5 GHz and about 20 GHz.

23. The apparatus of claim 3 wherein the fine-comb generator comprises a modelocked laser having a pulse repetition frequency about equal to $\Delta'$ or a phase modulator sideband generator operated at a modulation frequency about equal to $\Delta'$.

24. The apparatus of claim 3 wherein the second harmonic generator includes one or more nonlinear optical materials including one or more crystalline materials, one or more periodically poled materials, one or more thin film materials, or one or more nonlinear optical materials incorporated into a waveguide.

25. The apparatus of claim 24 wherein the second harmonic generator includes a periodically poled lithium niobate film on a silicon nitride waveguide on a silicon substrate.

26. The apparatus of claim 3 wherein each one of the photodetectors comprises a waveguide photodiode on a substrate.

27. The apparatus of claim 3 wherein the comb-generating laser, the coarse-comb generator, the fine-comb generator, the second harmonic generator, each photodetector, and the output laser are integrated onto a common substrate.

28. The apparatus of claim 27 wherein one or more electronic processors or circuit elements are integrated onto the common substrate.

* * * * *